(12) United States Patent
Zhou

(10) Patent No.: US 6,768,170 B2
(45) Date of Patent: Jul. 27, 2004

US006768170B2

(54) SUPERJUNCTION DEVICE WITH IMPROVED AVALANCHE CAPABILITY AND BREAKDOWN VOLTAGE

(75) Inventor: Ming Zhou, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/383,434

(22) Filed: Mar. 6, 2003

(65) Prior Publication Data

US 2003/0151045 A1 Aug. 14, 2003

Related U.S. Application Data

(63) Continuation of application No. 09/927,027, filed on Aug. 9, 2001, now abandoned.

(51) Int. Cl.[7] .................. H01L 31/113; H01L 29/76; H01L 29/94; H01L 31/062; H01L 31/119
(52) U.S. Cl. .................. 257/341; 257/339; 257/487
(58) Field of Search .................. 257/339, 341–343, 257/487

(56) References Cited

U.S. PATENT DOCUMENTS

| 4,284,997 A | 8/1981 | Nishizawa |
| 4,375,124 A | 3/1983 | Cogan |
| 4,587,712 A | 5/1986 | Baliga |
| 5,766,966 A | 6/1998 | Ng |
| 6,040,600 A | 3/2000 | Uenishi et al. |
| 6,140,679 A | 10/2000 | Ferla et al. |

OTHER PUBLICATIONS

Simulated Superior Performances of Semiconductor Superjuction Devices, Tatsuhiko Fujihira and Yasushi Miyasaka, Proceedings of 1998 Intellectual Symposium on Power Semiconductor Devices & ICS, Kyoto.

Analysis of the Effect of Charge Imbalance on the Static and Dynamic Characteristics of the Super Junction Mosfet, Praveen M. Shenoy, Anup Ghalla and Gary M. Dolny, pp. 99–102, 1999 IEEE.

*Primary Examiner*—Mary Wilczewski
*Assistant Examiner*—Monica Lewis
(74) *Attorney, Agent, or Firm*—Ostrolenk, Faber, Gerb & Soffen, LLP

(57) ABSTRACT

A superjunction device has a plurality of equally spaced P columns in an N⁻ epitaxial layer. The concentration of the P type columns is made greater than that needed for maintaining charge balance in the N⁻ epi region and the P columns thereby to increase avalanche energy. An implant dose of 1.1E13 or greater is used to form the P columns.

6 Claims, 1 Drawing Sheet

SUPERJUNCTION DEVICE WITH IMPROVED AVALANCHE CAPABILITY AND BREAKDOWN VOLTAGE

RELATED APPLICATION

The application is based on and claims benefit of U.S. application Ser. No. 09/927,027, filed Aug. 9, 2001 now abandoned, entitled Superjunction Device with Improved Avalanche Capability and Breakdown Voltage, to which a claim of priority is made.

FIELD OF THE INVENTION

This invention relates to semiconductor devices and more specifically relates to a superjunction type power MOSFET with increased avalanche energy.

BACKGROUND OF THE INVENTION

Superjunction power MOSFETs are well known. The static and dynamic characteristics of such devices are also described in "Analysis of the Effect of Charge Imbalance on the Static and dynamic Characteristics of the Superjunction MOSFET by Proveen M. Shenoy, Anup Bhalla and Gray M. Dolay, Proceeding of the ISPSD '99, pp. 99–102, June 1999.

In such devices, the avalanche capability, sometimes called "ruggedness" is determined mainly by the means of preventing the turn on of the inherent parasitic bipolar transistor in a DMOS type MOSgated device. However, in the superjunction device, the concentration of the P type columns is chosen to maintain charge balance in the active area of the epitaxial silicon body material. This requirement lowers the avalanche capability of the device because the high field locates in the N type region of the epitaxial silicon layer, resulting in a higher base resistance $R_b^1$ in the avalanche current path through the N type region and to the N+ source. Thus, in some designs, avalanche energy, that is, the amount of energy which is produced in avalanche without failure, has been as low as 50 millijoules. Attempts to increase this energy results in a reduction of the device breakdown voltage.

It would be desirable to increase the avalanche energy of a superjunction device without degrading the breakdown voltage.

BRIEF DESCRIPTION OF THE INVENTION

In accordance with the invention, the P column dose in a superjunction device is increased to a value intentionally higher than that required for charge balance in apparent disregard of the accepted theory and design rules for superjunction devices. By doing so, the high field location moves from the N region to the P column, and, therefore, a lower $R_b^1$ or lateral base resistance is experienced by the avalanche current through the P column to the source. Thus, the avalanche capability of the device is significantly improved (by a factor greater than 10) without degrading breakdown voltage.

For example, in a prior design using an N epi layer concentration of 1.26E15 and a P column dose of about 1E13, the P column dose was increased to 1.1E13 and avalanche energy was increased from 50 millijoules to 2500 millijoules. The P column dose to be used is dependent on die size and it was found that a higher dose can be used on smaller area die. Thus, a P column dose of 1.2E13 was used for a die of size 110×140 mils; while a dose of 1.1E13 was used on larger die of 257×330 mils and 315×450 mils. In all cases, a dose of 1.1E13 to 1.3E13 can be used to improve avalanche capability without adversely affecting breakdown voltage.

DETAILED DESCRIPTION OF THE PREFERRED EMBODIMENTS

Figure 2:
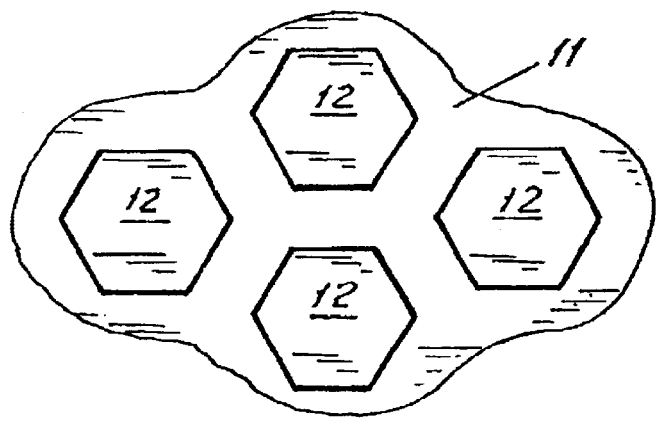
FIG. 2 is a cross-sectional view of the die taken across section line 2—2 in FIG. 1 to show the topology of the P type pedestals or channels.
Figure 1:
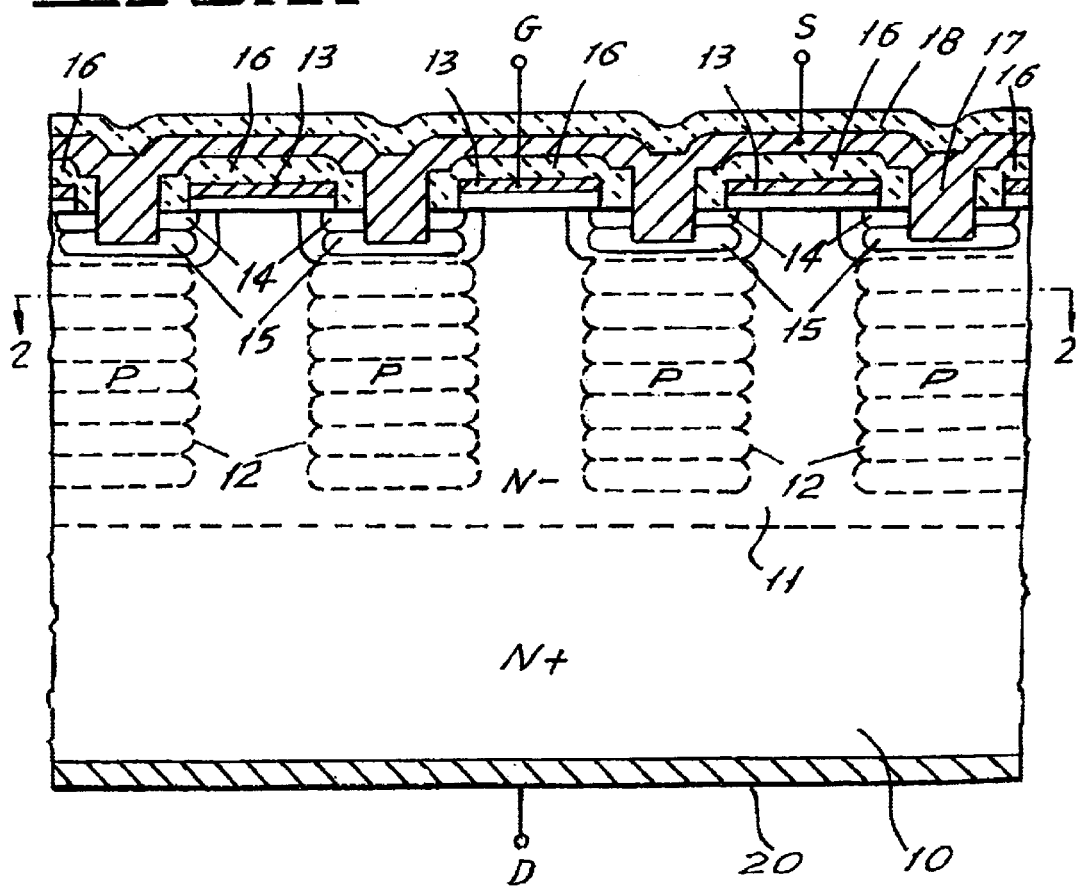
FIG. 1 is a cross-section of a small area of a superjunction die and is a cross-section of a portion of FIG. 2 taken across section line 2—2 in FIG. 1 and is a cross-section of a portion of FIG. 2 taken across section line 2—2 in FIG. 1.

Referring to FIGS. 1 and 2, there is shown a silicon die having an N+ body 10 which has an epitaxially deposited N⁻ top layer 11 formed thereon. Note that the term epitaxial layer means a layer of silicon which was grown by an epitaxial process. Layer 10 is about 500 microns thick and layer 11 is about 17 microns thick for a 500 volt device. The N⁻ concentration is typically about 1.26 atoms/cm³ (or about 3.5 ohm cm).

A plurality of spaced P columns 12 are formed in layer 11 as shown. P columns may have a depth of about 6.4 microns and a center-to-center spacing of about 15 microns. The P columns are shown as hexagonal in section, but they can have any other shape and; if desired, may be rectangular, square, or even have a parallel elongated stripe form. When hexagonal as shown, the hexagonal columns may be 6.4 microns wide when measured perpendicular to parallel sides, and may be spaced by about 8.6 microns from all adjacent columns.

The P columns may be fabricated by sequentially growing N⁻ epitaxial layers about 6.4 microns thick and diffusing the hexagonal P layers which are aligned with one another to build the full P column. As will be later emphasized, the P columns 12 are formed by implants of boron at 80 KeV and at a dose of 1.1E13 or greater, but in accordance with the invention, will have a value which is greater than that needed for charge balance between the N⁻ epitaxial silicon 11 and the P columns 12.

After forming the P columns 12, a gate oxide and a conductive polysilicon lattice 13 (atop the gate oxide) are formed in the lattice space between columns 12. A shallow N+ source 14 is then formed into the top of each column 12 as by implantation and diffusion, to define channel regions under the gate 13. A thin P+ contact layer 15 is formed beneath each source layer 14. The top of polysilicon gates 13 are capped by an interlayer oxide 16 and a shallow trench is formed through sources 14 and into P+ regions 15. An aluminum source electrode 17 is then formed atop the upper surface of the die, making contact with source regions 14 and P+ regions 15. The top of source 17 is covered by a suitable passivation layer 18. A drain electrode 20 is formed on the bottom of die 10.

In accordance with the invention the concentration in the P column is greater than needed for charge balance to the surrounding N⁻ epitaxial silicon. In particular and with an N⁻ region resistivity of 3.5 ohm cm and the dimensions given, a P concentration defined by an implant dose of $1.0 \times 10^{13}$ atoms/cm² would be used in the prior art. In accordance with the invention however, and for a die of 315×450 mils, the dose of 1.1E13 for columns 12 increased avalanche energy over 10 fold. For a smaller die of 110×140 mils, a dose of $1.2 \times 10^{13}$ atoms/cm² can be used with the same benefit.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor device comprising:
   a die of a given size, said die including,
   a substrate of a first conductivity type;
   an epitaxial layer of said first conductivity formed over said substrate;
   a plurality of channel regions of a second conductivity formed in said epitaxial layer;
   a plurality of source regions formed, adjacent said channel regions each said source region being spaced from said epitaxial layer by an invertible channel region, each said source region being spaced from said epitaxial layer by an invertible channel region;
   a gate structure formed over each channel region; and
   a column of said second conductivity formed below each source region in said epitaxial layer, each said column having a charge concentration that is higher than needed for charge balance with said epitaxial layer adjacent thereto;
   wherein said charge concentration in said columns is selected in relation with said size of said die to increase the avalanche energy of said device.

2. A semiconductor device according to claim 1, wherein said first conductivity is N-type and said second conductivity is P type.

3. A semiconductor device according to claim 1, wherein said size of said die is 110×140 mils, and said charge concentration in said column is 1.2E13.

4. A semiconductor device according to claim 1, wherein said size of said die is 315×450 mils, and said charge concentration in said column is 1.1E13.

5. A semiconductor device according to claim 1, wherein said charge concentration for said columns is selected from 1.1E13 to 1.3E13.

6. A semiconductor device according to claim 1, wherein said charge concentration for said columns increases as said size of said die decreases.

* * * * *